United States Patent [19]

Maier et al.

[11] Patent Number: 4,731,876
[45] Date of Patent: Mar. 15, 1988

[54] VHF MIXER CIRCUIT WITH BAND DEPENDENT SWITCHING

[75] Inventors: Gerhard Maier, Dauchingen; Bertram Fischer, Deisslingen; Erich Kirschner, Göllsdorf, all of Fed. Rep. of Germany

[73] Assignee: Deutsche Thomson-Brandt GmbH., Villingen-Schwenningen, Fed. Rep. of Germany

[21] Appl. No.: 778,149

[22] Filed: Sep. 20, 1985

Related U.S. Application Data

[63] Continuation-in-part of PCT EP85/00013, Jan. 16, 1985, published as WO85/03393, Aug. 1, 1985.

[30] Foreign Application Priority Data

Jan. 20, 1984 [DE] Fed. Rep. of Germany ....... 3401863

[51] Int. Cl.$^4$ .............................................. H04B 1/28
[52] U.S. Cl. .................................. 455/333; 455/323; 329/101; 329/103
[58] Field of Search ................. 455/333, 323; 329/101, 329/102, 103

[56] References Cited

U.S. PATENT DOCUMENTS 2,996,680  8/1961  Barry et al. ......................... 329/102
3,064,197 11/1962  Ek ....................................... 329/101
3,458,819  7/1969  Cafarella et al. .................... 455/333
4,412,353 10/1983  Itoh ..................................... 455/323

Primary Examiner—Robert L. Griffin
Assistant Examiner—Elissa Seidenglanz
Attorney, Agent, or Firm—Horst M. Kasper

[57] ABSTRACT

A mixer circuit with a conventional very high frequency circuit for the reception of color television bands I and III, which is connected dependent on the band and which is provided with an NPN transistor. The NPN transistor operates via a collector resistor onto a two circuit band filter. Moiré interferences in the band I region expanded for CATV are avoided by having the mixer current used to 0.3 to 0.6 mA via a counter coupling resistor disposed between base and hot end of the resistor 4. Thus the self-interference in band I is reduced by a value of about 60 dB. In case of band III operation the corresponding switching voltage is fed via a series connection of a diode 6 and a resistor 5 to the base and thus the base level is lifted up to higher mixing current, since in band III self-interferences cannot occur in the case of the presence of signals.

17 Claims, 1 Drawing Figure

VHF MIXER CIRCUIT WITH BAND DEPENDENT SWITCHING

CROSS-REFERENCE TO RELATED APPLICATIONS

This application is a continuation-in-part application of another application filed Jan. 16, 1985 and bearing application Ser. No. PCT/EP85/00013. This claim is made under Section 35 U.S.C. 365 (c), under Section 35 U.S.C. 371 and under any other Section of the U.S.C. supporting such claim.

BACKGROUND OF THE INVENTION

1. Field of the Invention

The invention relates to mixer circuit for the very high frequency (VHF) television transmission bands I and III, which is switched dependent of the bands and which includes a mixer transistor, which operates via a collector resistor onto a two circuit intermediate frequency band filter, where the collector voltage is fed to the transistor via a band filter and a resistor.

2. Brief Description of the Backround of the Invention Including Prior Art

The mixer circuit set forth above is very common with television receiver circuits. Extremely interfering occurrences are found in band I both in Europe as well as in the United States, where the band I is expanded for CATV. These interferences are noted as Moiré pattern on the screen. The band I designates a frequency region of from about 47 to 68 MHz and the band III designates a frequency region of from about 174 to 223 MHz. The channel Y is distributed in Cable Television grids and is associated with a picture carrier frequency of 76.25 MHz. In this context an interfering frequency of 37.35 MHz is generated as a mixer result. The signal of 37.35 MHz corresponds in the video region to an interfering frequency of 1.55 MHz, which can be seen as a Moiré pattern.

From the equation $$2 \times B_T - F_{OSC} = F_{INTER}$$

results that:

$$2 \times 76.25\ MHz - 115.15\ MHz = 37.35\ MHz.$$

It can be recognized from this that the emitting station interferes with itself without any additional effects of other stations.

The channel 6 in the United States generates "colorbeat", which is also present in Band I as antenna "Off Air Info" and a self interfering Moiré frequency of 0.75 MHz is present in the video region. From this is deduced $$2 \times B_T - F_{OSC} = F_{INTER}$$

$$2 \times 83.25\ MHz - 124.5\ MHz = 42\ MHz.$$

A band switching with the aid of switching diodes is known for example from the book by B. Morgenstern: Farbfernsehtechnik, 1977, B. G. Teubner, Stuttgart, Federal Republic of Germany, pages 134 and 135. However this does not represent a band dependent switching of a mixer.

It can be recognized from the German Patent Application laid open DE-OS No. 28 33 053, that the first basic part of the object of the reference agrees with the object of the present application, which is to eliminate Moiré interferences. The object is recited on page 5, 2nd paragraph of the above patent application and states "in particular a channel selector is to be created, which is associated with a separating circuit for a peak value formation circuit, in order to avoid the generation of a "beat component". Therefore one starts in the recited patent application at the known wide band mixer according to FIG. 1 of the reference which is provided after the amplifier stage with the transistor 3 in emitter connection of peak value formation circuit 5 of the kind of a low pass filter. The low pass filter circuit comprises of a capacitor 4, a coil 8 and a capacitor 9. This circuit 5 serves to supress the passage of an interference signal in the intermediate frequency circuit signal. The transistors 2, 3, 7 and the capacitor 9 are provided in the configuration of an integrated circuit in this known example, where only the capacitor 4 and the coil 8 are connected externally to the integrated circuits.

This mixer of FIG. 1 of the reference is associated with a damping characterizing line, which is designated as 14a in FIG. 4, which does not drop down abruptly enough at high frequencies, whereby the interfering signal component which has a higher frequency than the intermediate frequency band is not sufficiently damped in order to prevent the generation of a best interference occurrence by necessity.

This problem is resolved according to claim 1 of this reference patent application by employing a second capacitor 26 parallel to the inductivity $L_p$ for forming a separating circuit together with the inductivity. This secondary step according to FIG. 2 of the reference, which changes the load impedance $/Z_1/$ for the transistor 23, generates also an alternating voltage effect and results in the generation of the curve course 15b of FIG. 5. It is too low for the intermediate frequency and the recited mixing frequency. It is a result of this that a large current flows in the transistor 23, which renders the dynamic region of the transistor 23 small and which forces a nonlinear operation in the transistor 23. Consequently, a beat component is generated. If this occurs in the transistor 23, than this interfering component, since it falls into the intermediate frequency band, is fed to the intermediate frequency amplifier 12 without damping via the peak value formation circuit 25, even if this circuit is provided with the recited separating circuit.

According to the circuit of FIG. 3 of the reference, a variant of the solution of the reference is provided which eliminates this defect by switching and connecting the capacitor 26 not directly parallel to the inductivity $L_p$ but by placing this capacitor in parallel to the base emitter section of the transistor 23. Advantageously in this context the capacitor 26 forms part of the integrated circuit. Thus the load impedance $Z_L$ takes on the shape of the line 15e in FIG. 5. Now the load impedancy $Z_L$ for the best frequencies is sufficiently large. Therefore the current flowing through the transistor 23 becomes small for the best frequencies and its dynamic region becomes large.

Thus according to this patent application in addition the control voltages of the generated beat frequencies are supressed depending on frequencies. The transistor 23 is blocked nearly completely in the region of the critical frequencies. Thus the solution according to reference 1 is basically secondary step by which a high voltage current impedance is generated for two of the best frequencies to be supressed.

SUMMARY OF THE INVENTION

1. Purposes of the Invention

It is a purpose of the invention to eliminate the initially described Moiré interferences at television receiver sets.

It is a further object of the present invention to supress self interference in the bands I and III in a television receiver set.

It is a further object of the present invention to provide a method for adjusting the operating point of the mixer transistor in a color television receiver set.

These and other objects and advantages of the present invention will become evident from the description which follows.

2. Brief Description of the Invention

The present invention provides a mixer circuit for the VHF-television transmission bands I and III. A mixer transistor has a base, an emitter and a collector. A collector resistor has one terminal connected to the collector of the mixer transistor and where a second terminal of the base transistor is connected to ground. A two pole intermediate frequency filter is connected with a first terminal to a second terminal of the collector resistor. A current limiting resistor is connected to a second terminal of the two pole intermediate frequency filter, where the collector voltage is fed to the transistor via the current limiting resistor, the two pole intermediate frequency filter and the collector resistor. A base resistor is connected to the base of the mixer transistor. A series circuit of a diode and a resistor are connected to the base of the mixer transistor, where a second terminal of the series circuit is connected to ground. A resistor for operating point adjustment is disposed between the base of the mixer transistor and the second terminal of the two pole intermediate frequency filter, where the resistor for operating point adjustment together with the base resistor form a voltage divider, which is dimensioned such that self-disturbances in the band I are suppressed while during operation in the region of band III the basis level of the same mixer transistor is modified such by the switching circuit for band III via the series circuit of the diode and the resistor that the mixer current is substantially increased in comparison with the mixer current corresponding to the band I.

The mixer current can be decreased to a value of from about 0.3 to 0.6 milliampere during band I type operation.

The self disturbances during band I type operation can be reduced by more than 60 dB as compared to a conventional circuit.

A series connection of a resistor and a capacitor can be disposed in parallel to the series connection of resistor and diode.

A series connection of a diode, a resistor and a capacitor can have two connecting points and are connected to the series connection of resistor and capacitor such that one connecting point can be connected to the mixer transistor base via the capacitor and the second connecting point can be connected to VHF source.

Thus according to the present invention a mixer circuit is provided which reduces the interference during a reception of colored television signals. The solution provided according to the present invention is a primary step, where depending on the band a DC voltage is employed for applying to the mixer and bringing the mixer to the optimum operating point with the object of preventing abinitio over a broad band the generation of beat frequencies.

The subject matter of the invention discloses that the objects of the invention are advantageously resolved with DC current by a region dependent change of the operating point.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

In the accompanying drawing, in which are shown several of the various possible embodiments of the present invention.

DESCRIPTION OF INVENTION AND PREFERRED EMBODIMENT

Figure 1:
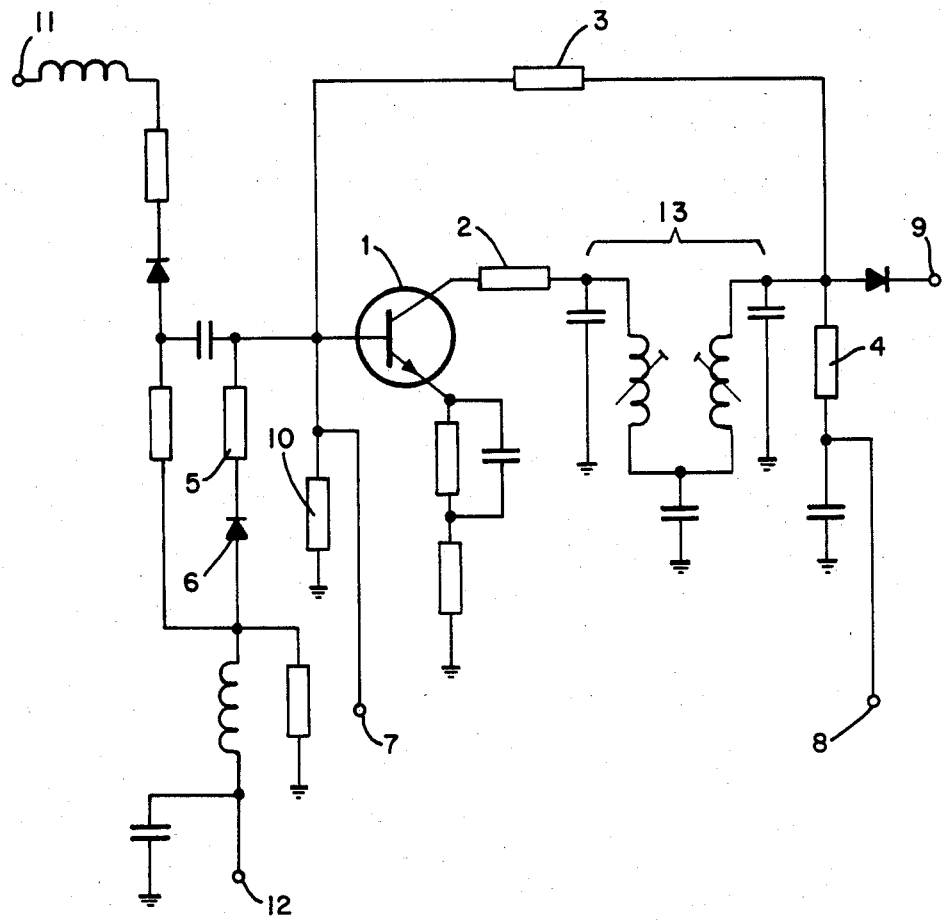
FIG. 1 is a schematic circuit diagram of a television receiver circuit including the switching steps for the operating point of the mixer transistor.

In accordance with the present invention there is provided a mixer circuit for very high frequency television transmission bands I and III, which is switched dependent on the band and which is provided with transistor 1, which operates via a collector resistor 2 on a two circuit intermediate frequency band filter 13. The collector voltage is fed to the transistor 1 via the band filter 13 and the resistor 4. This circuit arrangement is provided with DC current behavior depending on the region dependent change of the operating point of the mixer transistor 1. Resistor 3 is inserted between the connection point of the band filter 13 and the resistor 4 and the base of the transistor 1. The resistor 3 and the base resistor 10 of the transistor 1 form a voltage divider, which is dimensioned such that the mixer current is lowered to such an extent that the self interferences in the band I are suppressed while during operation in band III the base and level of the same mixing transistor 1 is changed during operation in band III by the switching voltage for band III via a series of diodes 6 an a resistor 5, such that the mixer current is increased and lifted up to a substantial degree as compared to the mixer current of the band I.

The mixer current during operation in band I can be lowered to a value of 0.3 to 0.6 mA. The self interference in band 1 can be reduced to a value which is about 60 dB.

The mixer circuit arrangement is shown by way example for very high frequency mixer for the band I and III as shown in FIG. 1. The mixer transistor 1 operates via the collector resistor 2 on two circuit band filter 13. The collector voltage is fed in via the resistor 4 to the connection 8 for providing a voltage of 12 volts. The intermediate frequency is picked up for further amplification at the terminal 9. The high frequency voltage is fed to the preamplifier at the connection 11. The oscillator voltage is fed to the base via the connector 7. A resistor 3 is disposed between the "hot" end of the resistor 4 and the basis. The resistor 3 operates as a counter coupling and at the same time with the aid of a voltage divider acts on the base, which voltage divider comprises a resistor 3 and base resistor 10, and reduces the collector current to a value of from between about 0.3 and 0.6 mA. This lowering of the mixer current also lowers the self interference in channel Y of the band I expanded for CATV in Europe as well as the self interference of the antennas "OFF AIR Info" in the United States in the region of the band I by 60 dB. The mixer is fed into the band III via the series connection of diode 6 and resistor 5 with a corresponding switching voltage via connection 12. The base level is thereby increased such that the mixer current required for this band actually occurs. The self interferences are not present in the band III in case a signal is coming in.

The invention operates as follows. The counter coupling becomes effective by the "hot end" of the resistor 4 becoming active via resistor 3 and effect counter coupling at the base of the transistor 1. The counter coupling is effective only like a DC current and it contains no frequency dependent parts and components. At the same time the collector current is reduced by way of the thus acting current of voltage divider at the base. In consequence thereof, all interfering mixing products are lowered advantageously by about 60 dB for the mixing products which are interfering and which are broad band for the band I. Thus the interfering frequencies remain effectively damped such that they cannot have any further effect. During the operation of the mixer in the band region III the correspondence switching votlage lifts up the base level via a series connection of a diode and of a resistor, such that a current is generated as required for band III.

From the recited reference patent application laid open it thus can be gathered, that the goal of eliminating the Moiré interferences is achieved via the longer path of the load impedance change for the interfering frequencies. However, for this purpose an expensive balancing method for the load impedances is required. There are required pole positions at certain frequencies in the damping circuit characteristic curves based on correspondingly dimensioned and frequency dependent components. In contrast, the non-generation of interfering components is achieved according to the disclosure of the present invention by providing a band dependent switching of the mixer working and operating point by a DC current and the simultaneous feeding part of the intermediate frequency voltage from the output of the intermediate frequency filter by the resistor 3 is provided as a broad band onto the base of the mixer transistor 1.

While according to the reference patent application laid open substantially only a limited certain frequency is influenced by the blind components in the counter coupling path, and it is suppressed, it is achieved with the primary step according to the subject matter of the invention to avoid generation of broad band dependent interfering mixing products.

It will be understood that each of the elements described above, or two or more together, may also find a useful application in other types of transmission system configurations and video signal processing procedures differing from the types described above.

While the invention has been illustrated and described as embodied in the context of a VHF Mixer circuit with band dependent switching, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A mixer circuit for the VHF-television transmission bands I and III comprising
   a mixer transistor having a base, an emitter and a collector, where emitter and collector represent intermediate frequency power connections of the mixer transistor and where the collector provides a collector voltage during operation;
   an input terminal connected to the base of the mixer transistor for applying an oscillator voltage to the base;
   a collector resistor having a first terminal connected to the collector of the mixer transistor;
   a two pole intermediate frequency filter connected with a first terminal to a second terminal of the collector resistor;
   an output terminal connected to a second terminal of the two pole intermediate frequency filter;
   a current limiting resistor connected to the second terminal of the two pole intermediate frequency filter, where the collector voltage is fed to the transistor via the current limiting resistor, the two pole intermediate frequency filter and the collector resistor;
   a base resistor having a first terminal connected to the base of the mixer transistor, where a second terminal of the base resistor is connected to ground;
   a series circuit of a diode and a resistor having a first terminal connected to the base of the mixer transistor, where a second terminal of the series circuit is connected to ground; and
   a resistor for operating point adjustment disposed between the base for the mixer transistor and the second terminal of the two pole intermediate frequency filter, where the resistor for operating point adjustment together with the base resistor form a voltage divider, which is dimensioned such that self-disturbances in the band I are suppressed while operating in the band I and that while operating in the region of band III the base voltage level of the same mixer transistor is modified by a switching of the voltage resulting for band III via the series circuit of the diode and the resistor such that the mixer current while operating in band III is substantially increased in comparison with the mixer current corresponding to operating in the region of band I.

2. The mixer circuit for the VHF-television transmission bands I and III according to claim 1 wherein the series circuit connected to the base of the mixer transistor is dimensioned such that the collector current running through the mixer transistor is decreased to a value of from about 0.3 to 0.6 milliampere during band I type operation.

3. The mixer circuit for the VHF-television transmission bands I and III according to claim 1 wherein the series circuit connected to the base of the mixer transistor is dimensioned such that self disturbances of the mixer circuit during band I type operation are reduced by more than 60 dB as compared to a conventional circuit.

4. The mixer circuit for the VHF-television transmission bands I and III according to claim 1 wherein a series connection of a resistor and a capacitor having a first terminal connected to the base of the mixer transistor and having a second terminal connected to ground such that the series connection of resistor and capacitor is disposed in parallel to the series circuit connection of resistor and diode.

5. The mixer circuit for the VHF-television transmission bands I and III according to claim 1 further comprising
a series connection of a diode, a resistor and a capacitor having two connecting points and connected to the series circuit connection of resistor and diode such that one connecting point of the series connection of diode, resistor and capacitor is connected to the mixer transistor base via the capacitor and the second connecting point is connected to VHF source via the resistor.

6. The mixer circuit for the VHF-television transmission bands I and III according to claim 1 wherein the series circuit connected to the base of the mixer transistor in dimensioned such that a DC current behavior is obtained based on a band region dependent change of the operating point of the mixer transistor.

7. The mixer circuit for the VHF-television transmission bands I and III according to claim 1 wherein a series circuit connected to the base of the mixer transistor is dimensioned such that a DC voltage depending on the desired band operation is employed for applying to the base of the mixer transistor for preventing ab initio over a broad band the generation of beat frequencies.

8. The mixer circuit for the VHF-television transmission bands I and III according to claim 1 wherein a series circuit connected to the base of the mixer transistor is dimensioned such that a DC current becomes effective for a region dependent change of the operating point of the mixing transistor.

9. The mixer circuit for the VHF-television transmission bands I and III according to claim 1 wherein the circuit via the resistor for operating point adjustment effects a counter coupling at the base of the mixing transistor.

10. The mixer circuit for the VHF-television transmission bands I and III according to claim 9 wherein the counter coupling via the resistor for operating point adjustment is effective only like a DC current and where the counter coupling is free from any frequency dependent parts or components.

11. The mixer circuit for the VHF-television transmission bands I and III according to claim 10 wherein the resistor for operating point adjustment of the mixer circuit is dimensioned such that during operation of the counter coupling a collector current of the mixing transistor is reduced for lowering all interfering mixing products by about 60 dB.

12. The mixer circuit for the VHF-television transmission bands I and III according to claim 1 wherein a series circuit connected to the base of the mixer transistor is dimensioned such that a DC current is generated for band dependent switching of a mixer transistor working and operating point and a feeding back of part of the intermediate frequency voltage from an output of the intermediate frequency filter onto the base of the mixer transistor for avoiding generation of broad band dependent interfering mixing products.

13. A method for signal mixing in receivers for the VHF-television transmission bands I and III comprising the steps of
employing a mixer transistor having a base, an emitter and a collector, where the collector provides a collector voltage during operation;
applying an oscillator voltage to the base of the mixer transistor via an input terminal connected to the base of the mixer transistor;
connecting a collector resistor with a first terminal to the collector of the mixer transistor and said collector resistor having a second terminal;
connecting a two pole intermediate frequency filter with a first terminal to the second terminal of the collector resistor;
picking up an intermediate frequency signal at an output terminal connected to a second terminal of the two pole intermediate frequency filter;
connecting a current limiting resistor to the second terminal of the two pole intermediate frequency filter;
feeding the collector voltage to the transistor via the current limiting resistor, the two circuit intermediate frequency filter and the collector resistor;
connecting a base resistor with a first terminal to the base of the mixer transistor and connecting a second terminal of the base resistor to ground;
connecting a series circuit of a diode and a resistor with a first terminal to the base of the mixer transistor, and connecting a second terminal of the series circuit to ground;
disposing a resistor for operating point adjustment between the base of the mixer transistor and the second terminal of the two pole intermediate frequency filter;
providing a voltage divider from the resistor for operating point adjustment and the base resistor to avoid while operating in band I self-disturbances in the band I by appropriate dimensions of the voltage divider; and
modifying the base level of the said mixer transistor during operation in the region of band III by a switching of the voltage resulting for band III via the series circuit of the diode and the resistor such that the mixer current while operating in band III is substantially increased in comparison with the mixer current corresponding to operating in the region of band I.

14. The method for signal mixing in receivers for the VHF-television transmission bands I and III according to claim 13 further comprising
employing a DC current for a region dependent change of the operating point; and
changing the operating point of the mixer transistor depending on the region for providing the circuit with DC current behavior.

15. The method for signal mixing in receivers for the VHF-television transmission bands I and III according to claim 13 further comprising
applying to the mixer transistor a DC voltage depending on a desired band operation for preventing over a broad band the generation of beat frequencies.

16. The method for signal mixing in receivers for the VHF-television transmission bands I and III according to claim 13 further comprising
effecting a counter coupling at the base of the mixing transistor, wherein the counter coupling is effective only like a DC current and does not contain any frequency dependent parts or components; and reducing a collector current of the mixing transistor at the time of the counter coupling for lowering all interfering mixing products by about 60 dB.

17. The method for signal mixing in receivers for the VHF-television transmission bands I and III according to claim 13 further comprising employing a DC current for band dependent switching of a mixer transistor working and operating point; and feeding simultaneously part of an intermediate frequency voltage from an output of the intermediate frequency filter onto the base of the mixer transistor for avoiding generation of broad band dependent interfering mixing products.

* * * * *